United States Patent
Zhang et al.

(10) Patent No.: US 12,538,542 B2
(45) Date of Patent: Jan. 27, 2026

(54) METHOD OF FORMING A MEOL CONTACT STRUCTURE

(71) Applicant: Applied Materials, Inc., Santa Clara, CA (US)

(72) Inventors: Shumao Zhang, San Jose, CA (US); Le Zhang, San Jose, CA (US); Weifeng Ye, San Jose, CA (US); Chih-Hsun Hsu, Santa Clara, CA (US); David T. Or, Santa Clara, CA (US); Gary How, Santa Clara, CA (US); Yiyang Wan, Sunnyvale, CA (US); Liqi Wu, San Jose, CA (US); Jiang Lu, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 445 days.

(21) Appl. No.: 18/196,833

(22) Filed: May 12, 2023

(65) Prior Publication Data

US 2024/0379768 A1    Nov. 14, 2024

(51) Int. Cl.
| | |
|---|---|
| *H10D 64/01* | (2025.01) |
| *H01L 21/02* | (2006.01) |
| *H01L 21/768* | (2006.01) |
| *H01L 21/285* | (2006.01) |

(52) U.S. Cl.
CPC ....... *H10D 64/01* (2025.01); *H01L 21/02063* (2013.01); *H01L 21/0214* (2013.01); *H01L 21/0223* (2013.01); *H01L 21/02252* (2013.01); *H01L 21/76831* (2013.01); *H01L 21/28518* (2013.01)

(58) Field of Classification Search
CPC .............. H10D 64/01; H01L 21/02063; H01L 21/02252; H01L 21/76814

USPC ........................................................ 438/655
See application file for complete search history.

(56) References Cited

U.S. PATENT DOCUMENTS

| | | | |
|---|---|---|---|
| 11,232,947 B1* | 1/2022 | Chu | ........................ H01L 21/56 |
| 2007/0015360 A1 | 1/2007 | Lu et al. | |
| 2010/0102415 A1 | 4/2010 | Millward et al. | |
| 2012/0064708 A1 | 3/2012 | Miyoshi et al. | |
| 2016/0293479 A1 | 10/2016 | Casteel, Jr. et al. | |
| 2020/0020578 A1 | 1/2020 | Chang et al. | |

OTHER PUBLICATIONS

International Search Report/ Written Opinion issued to PCT/US2024/015359 on Jun. 12, 2024.

* cited by examiner

*Primary Examiner* — Quoc D Hoang
(74) *Attorney, Agent, or Firm* — Patterson + Sheridan, LLP (57) ABSTRACT

Embodiments of the disclosure include a method of forming contact structure on a semiconductor substrate. The method includes treating a native oxide layer formed on a contact junction, wherein treating the native oxide layer forms a silica salt layer on the contact junction disposed within a contact feature that includes one or more surfaces that comprise silicon nitride. Then exposing the silica salt layer and the one or more surfaces to a plasma comprising oxygen, wherein the plasma forms a silicon oxynitride material on the one or more surfaces. Then removing the second silica salt layer, selectively forming a metal silicide layer on the contact junction, and then filling the contact feature with a metal, wherein filling the feature comprises selectively depositing a metal layer over the selectively formed metal silicide layer.

20 Claims, 4 Drawing Sheets

FROM FIG. 2F

FIG. 3

METHOD OF FORMING A MEOL CONTACT STRUCTURE

BACKGROUND

Field

Embodiments described herein generally relate to semiconductor device fabrication processes. More specifically, embodiments of the present disclosure relate to methods for forming contact structures within a semiconductor device.

Description of the Related Art

Integrated circuits have evolved into complex devices that can include millions of transistors, capacitors, and resistors on a single chip. In the course of integrated circuit evolution, functional density (that is, the number of interconnected devices per chip area) has generally increased while geometry size (that is, the smallest component (or line) that can be created using a fabrication process) has decreased.

Microelectronic devices are fabricated on a semiconductor substrate as integrated circuits in which various conductive layers are interconnected with one another to permit electronic signals to propagate within the device. An example of such a device include memory (for example, DRAM (dynamic random access memory)) and logic devices, including both planar and three-dimensional structures. Three-dimensional structures include finFET (fin field-effect transistor) or MOSFET (metal-oxide-semiconductor field-effect transistor) devices.

An example of finFET or MOSFET device includes a gate electrode on a gate dielectric layer on a surface of a semiconductor substrate. Source/drain regions are provided along opposite sides of the gate electrode. The source and drain regions are generally heavily doped regions of the semiconductor substrate. Usually a silicide layer, for example a titanium silicide layer, is required to form a reliable contact at the formed source and drain regions.

In a traditional middle-end-of-the-line (MEOL) contact junction formation process, a feature, such as a via or trench, is fabricated in the semiconductor substrate. A silicon (Si) or silicon/germanium (SiGe)-comprising contact region is formed in the trench or via bottom. MEOL contact junctions allow connections between front-end-of-the-line (FEOL) semiconductor structures and back-end-of-the-line (BEOL) interconnects. Contacts with a low resistivity are desirable in semiconductor devices. However, when a MEOL contact junction has a relatively high resistance, a poor connection is created at the MEOL contact junction, which reduces the overall performance of the packaged semiconductor structures.

Following a conventional silicide formation process, the feature is filled with a low resistivity metal, either by cobalt (Co) or tungsten (W). For a tungsten (W) contact, the structure is filled by either a traditional W conformal deposition process. Conventional fill processes form a seam during the filling process, which can cause a significant (greater than 50%) line resistance increase as compared to a completely filled feature. However, conventional silicide layer formation process require the formation of a deposited metal containing layer to be formed on the bottom, sidewalls and field regions of the substrate that leads to the formation of a seam in the feature when a conventional conformal chemical vapor deposition (CVD) or atomic layer deposition (ALD) process is used to fill the feature.

Therefore, there is a need in the art for a process that is used to form reliable contact structures and solve the problems described above.

SUMMARY

Embodiments of the disclosure include a method of forming contact structure on a semiconductor substrate. The method includes the following. Removing material from surfaces of a feature formed in a field region surface of the semiconductor substrate, wherein removing the material forms a reaction product material over at least one of the field region surface and surfaces within the feature, the surfaces within the feature comprise sidewalls and a contact surface, and the surface of the sidewalls comprise silicon nitride. Heating the substrate to a first annealing temperature to remove the reaction product material from the field region surface and the surfaces within the feature. Selectively forming a silica salt layer over the contact surface after the reaction product material has been removed from at least the contact surface of the surfaces within the feature. Exposing at least portion of the sidewalls and silica salt layer within the feature to a plasma that comprises an oxidizing agent. Heating the substrate to a second annealing temperature thereby substantially removing the silica salt layer from the contact surface. Forming a metal silicide layer on the contact surface, wherein forming the metal silicide layer on the contact surface comprises selectively depositing a first metal layer on the contact surface; and filling the feature with a metal, wherein filling the feature comprises selectively depositing a second metal layer on the formed metal silicide layer.

Embodiments of the disclosure include a method of forming contact structure on a semiconductor substrate. The method can include the following. Removing material from surfaces of a feature formed in a field region surface of the semiconductor substrate, wherein removing the material forms a reaction product material over at least one of the field region surface and surfaces within the feature, the surfaces within the feature comprise sidewalls and a contact surface, and the surface of the sidewalls comprise silicon. Removing the reaction product material from the field region surface and the surfaces within the feature. Selectively forming a silica salt layer over the contact surface after the reaction product material has been removed from at least the contact surface of the surfaces within the feature. Exposing at least portion of the sidewalls and silica salt layer within the feature to a plasma that comprises an oxidizing agent. Removing the silica salt layer from the contact surface. Forming a metal silicide layer on the contact surface, wherein forming the metal silicide layer on the contact surface comprises selectively depositing a first metal layer on the contact surface; and filling the feature with a metal, wherein filling the feature comprises selectively depositing a second metal layer on the formed metal silicide layer.

Embodiments of the disclosure include a method of forming contact structure on a semiconductor substrate. The method can include the following. Treating an oxide layer formed on a contact junction, wherein treating the oxide layer forms a first silica salt layer on the contact junction disposed within a contact feature, and the contact feature comprises one or more surfaces that comprise silicon nitride. Removing the first silica salt layer, and then forming a second silica salt layer on the contact junction. Exposing the second silica salt layer and the one or more surfaces to a plasma comprising oxygen, wherein the plasma forms a silicon oxynitride material on the one or more surfaces. Removing the second silica salt layer, and then selectively forming a metal silicide layer on the contact junction. Selectively forming a first metal layer on the selectively formed metal silicide layer; and filling the contact feature with a metal, wherein filling the feature comprises selectively depositing a second metal layer on the selectively formed first metal layer.

Embodiments of the disclosure include a method of forming contact structure on a semiconductor substrate. The method includes treating an oxide layer formed on a contact junction, wherein treating the oxide layer forms a silica salt layer on the contact junction disposed within a contact feature that includes one or more surfaces that comprise silicon nitride. Then exposing the silica salt layer and the one or more surfaces to a plasma comprising oxygen, wherein the plasma forms a silicon oxynitride material on the one or more surfaces. Then removing the second silica salt layer, selectively forming a metal silicide layer on the contact junction, and then filling the contact feature with a metal, wherein filling the feature comprises selectively depositing a metal layer over the selectively formed metal silicide layer.

BRIEF DESCRIPTION OF THE DRAWINGS

So that the manner in which the recited features of the present disclosure may be understood in detail, a more particular description of the disclosure may be had by reference to one or more embodiments, some of which are illustrated in the appended drawings. It is to be noted, however, that the appended drawings illustrate only one or more of the several embodiments; therefore, the one or more embodiments provided in the Drawings are not to be considered limiting of the broadest interpretation of the detailed scope. Other effective embodiments as may be described in the Detailed Description may be considered part of the envisioned detailed scope.

To facilitate understanding and better appreciation for the described scope, in some instances either identical or associated reference numerals have been used where possible to designate identical or similar elements that are common in the figures. One of skill in the art may appreciate that elements and features of one embodiment may be beneficially incorporated in one or more other embodiments without further recitation.

DETAILED DESCRIPTION

In the following disclosure, reference may be made to one or more embodiments. However, one of skill in the art does appreciate that the disclosure is not limited to specifically to the described embodiments. Rather, any combination of features and elements, whether related to different embodiments or not, is envisioned to implement and practice one or more embodiments provided by the disclosure. Furthermore, although the one or more embodiments presented in the disclosure may achieve advantages over other possible solutions, the prior art (if existing), and combinations thereof, whether or not a particular advantage is achieved by a given embodiment is not limited by this disclosure. The aspects, features, embodiments, and advantages provided are merely illustrative. These are not considered elements or limitations of the appended claims except where explicitly recited in one or more of the Claims. Likewise, one of skill in the art should not construe a reference to "the disclosure" as a generalization of any disclosed subject matter.

The present disclosure relates to methods and processes that permit bottom-up filling of a conductive material in a MEOL feature, such as a trench or via, during the formation of a contact junction while preventing the formation of a seam or "air gaps" within the conductor material formed in the feature. As the ratio of depth to width within the contact features has become greater, any conductive material that deposits onto the sidewalls of the feature may interfere with the attempt to deposit conductive material on the feature bottom. Continued deposition of conductive material on the sidewalls will foster the narrowing of the feature as the conductive material growth within the feature and towards an opposing sidewall. The growth on the sidewalls creates several problems. First, the material growing along the sidewalls is not able to reach the feature bottom near the silicon-containing contact, depriving the feature's bottom region of conductive material to perform a desired bottom-up type of material growth. Second, the conductive material growing along the sidewalls will create a seam within the conductive material growing along the sidewalls when the conductive material closes off the pathway to the feature bottom. This creates numerous processing and device operational problems that are well appreciated in the art.

Processes and methods that avoid these problems, especially the growth of conductive material along the feature sidewalls during conductive material deposition, are desirable.

A novel solution that is provided herein includes a passivation process sequence that selectively modifies the sidewalls of the device feature formed on the semiconductor substrate. During this "passivation" process, the material that comprises the feature sidewalls, which will include silicon nitride, is converted into an inert material that does not support the growth of a conductive material onto the feature sidewalls. Passivation, however, is not desired regarding the exposed silicon-containing contact located as part of the feature bottom, but the elegant solution provided prevents the passivation of the silicon-containing contact regions. By retaining a reaction product of a cleaning process (for example, a silica salt) used for preparing the device features for deposition of a conductive materials, which is formed on top of the silicon-containing contact, the cleaning process reaction product acts as a physical and chemical protective barrier against the subsequent passivation process, thereby preventing the passivation of the electrical contact. The passivation process has also been found not to alter the cleaning process reaction product itself. The cleaning process reaction product may then be removed separately after the passivation process is complete. After passivation and removal of the cleaning process reaction product, the conductive material may then be deposited starting at the bottom of the device feature. The conductive material does not build outwardly from the now-inert feature sidewalls. This solution eliminates both the issues of forming "air gaps" or a seam near the silicon-containing contact due to deposition vapors being blocked from accessing the silicon-containing contact and forming a seam in the middle of the conductive material in the device feature.

A "substrate" as used in this application may refer to a substrate or material surface formed on a substrate upon which film processing is performed during a fabrication process. For example, a substrate surface which may be processed may be comprised of a material such as, but not limited to, silicon (Si), silicon oxide ($SiO_2$), strained silicon, silicon on insulator (SOI), carbon doped silicon oxides, amorphous silicon, doped silicon, germanium (Ge), gallium arsenide, glass, sapphire, and any other conductive materials depending on the application, such as metals, metal nitrides, and metal alloys. Substrates include by way of example and without limitation semiconductor wafers. Substrates may be exposed to a treatment process(es) to polish, etch, reduce, oxidize, or anneal substrate surface.

The terms "precursor", "reactant", "reactive gas", and similar such terms referring to chemical species, as used in this application may refer to refer to one or more chemical species that may react with one or more exposed surfaces of a substrate or with one another and the resultant thereof then react with the exposed surfaces of a substrate.

A "liner" as used in this application may refer to a layer conformably formed along at least a portion of the sidewalls or bottom surface of an opening or trench such that a substantial portion of the opening prior to the deposition of a conductive fill layer. In one or more embodiments, a liner may be formed along the entirety of the sidewalls of a device feature. In one or embodiments, a liner may be formed along a portion of the bottom of a device feature. The liner along the portion of the bottom of the device feature may cover the entirety of the bottom of the device feature, which includes regions where the silicon-conductive contact is not present.

Figure 1:
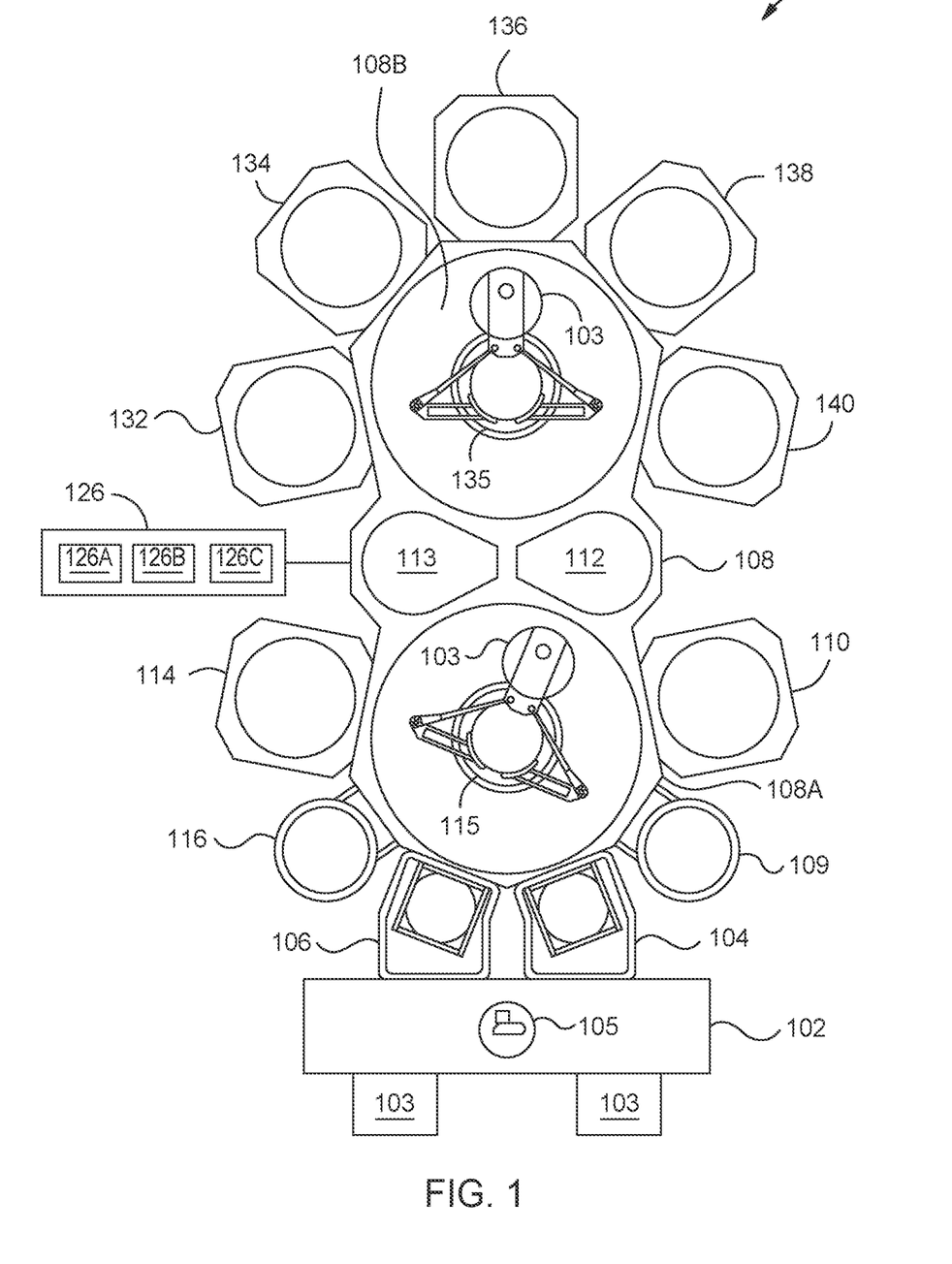
FIG. 1 illustrates a schematic top view of a multi-chamber processing system, according to embodiments described herein.
Figures 2A, 2B, 2C:
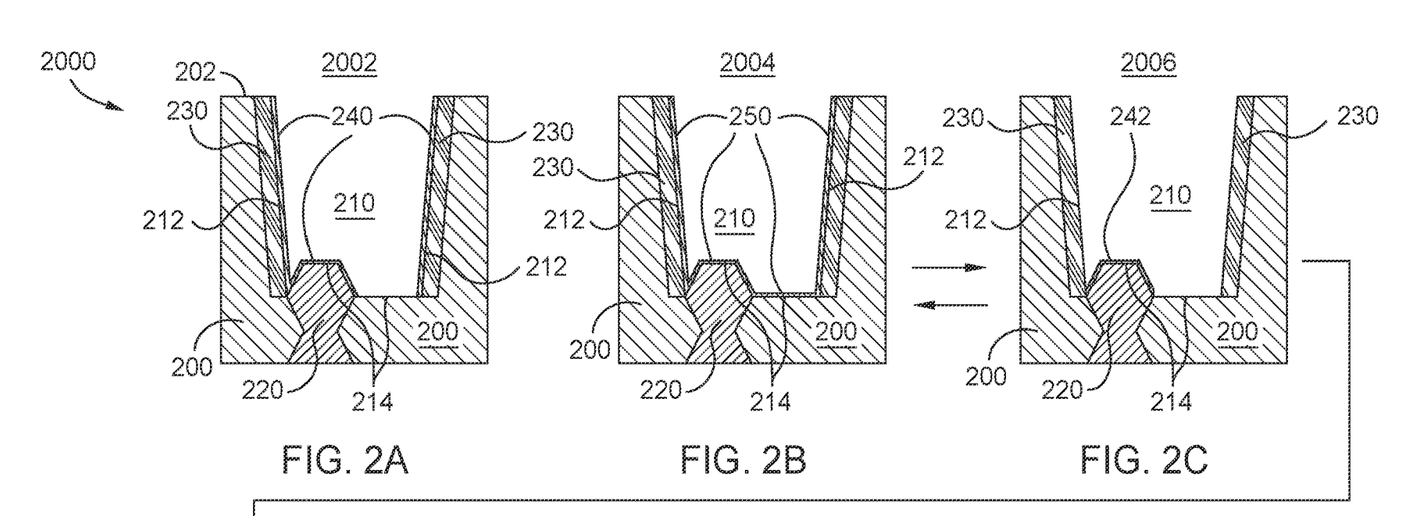
FIGS. 2A-2I are schematic drawings of several side cross-sectional views of a semiconductor substrate undergoing an embodiment process for treating a semiconductor substrate, according to one or more embodiments.
Figures 2D, 2E:
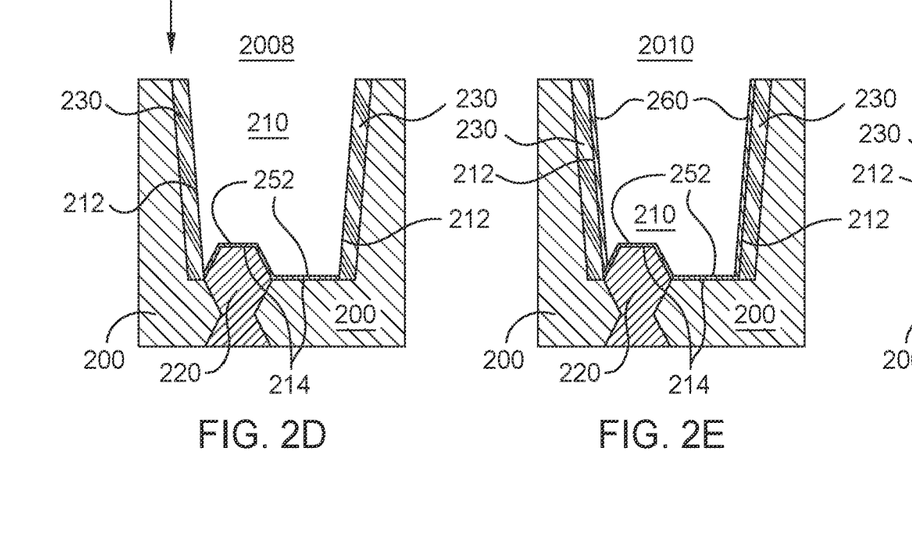
Figure 2F:
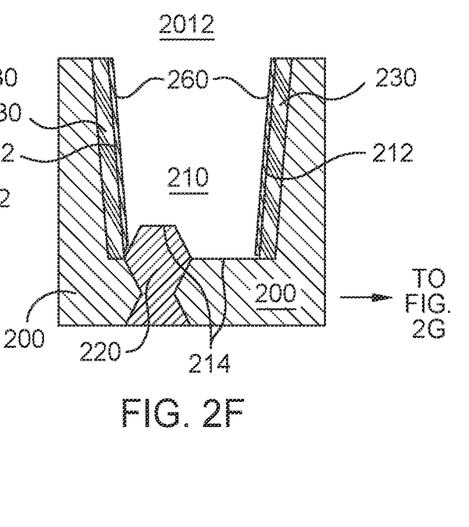
Figure 2G:
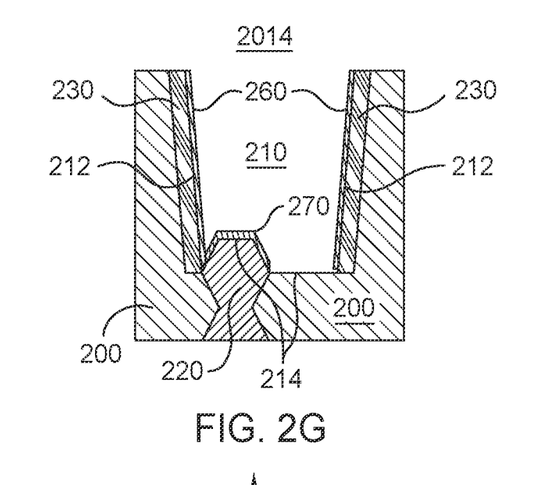
Figure 2H:
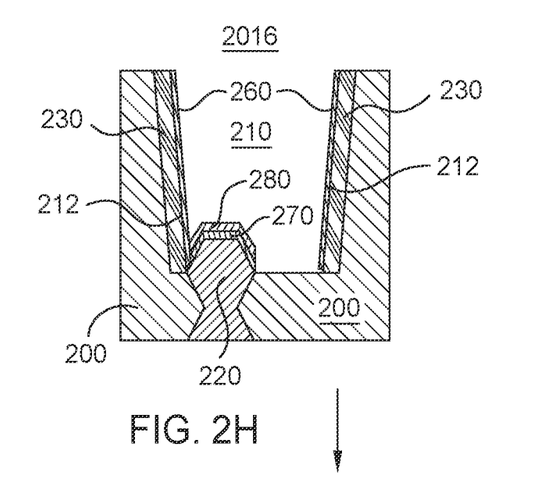
Figure 2I:
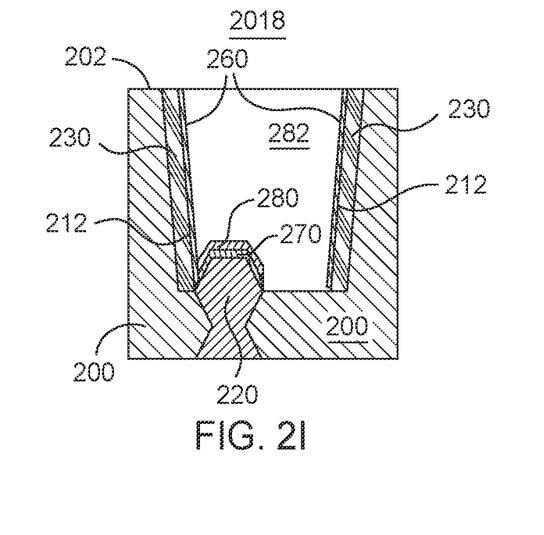
Figure 3:
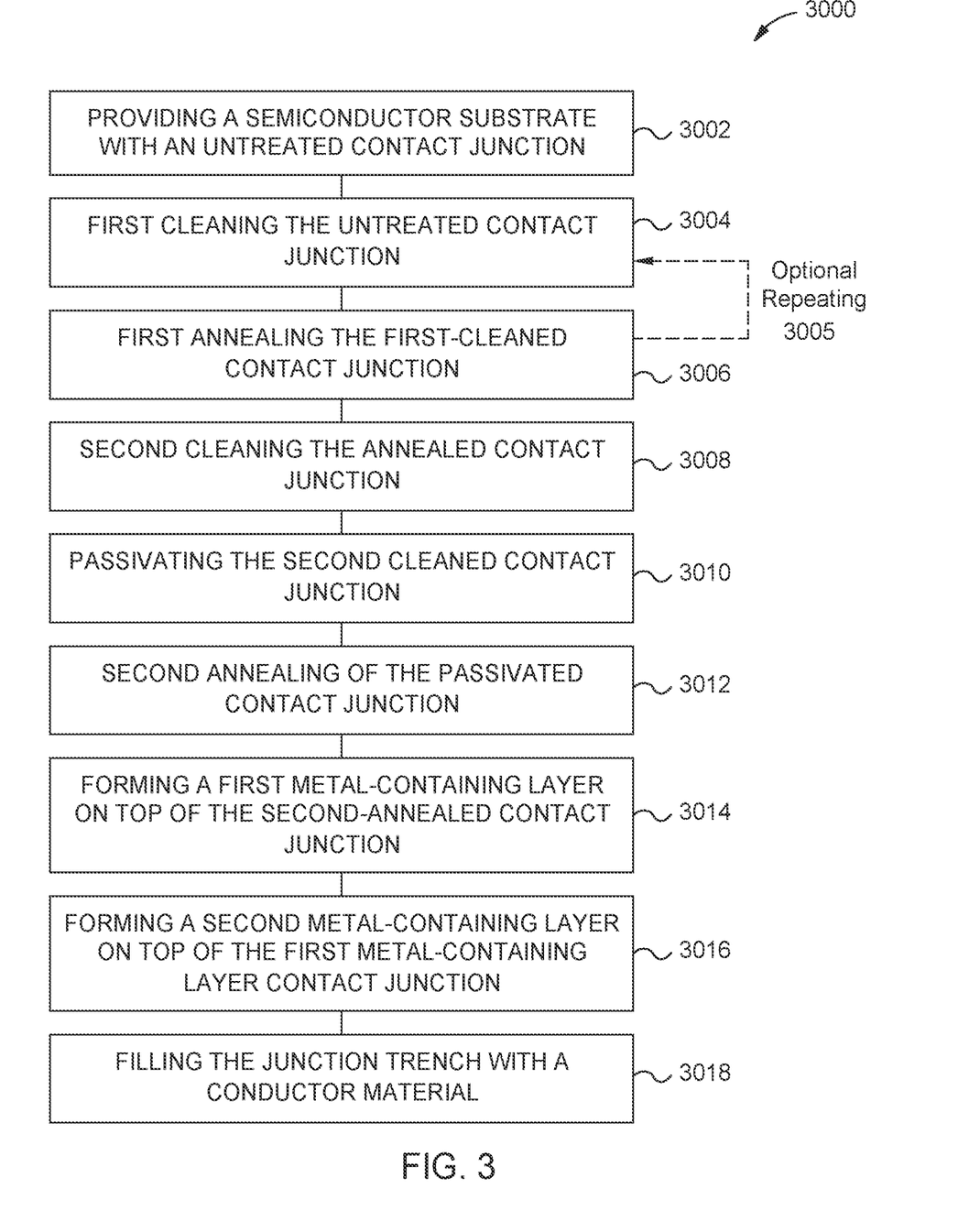
FIG. 3 is a process flow diagram representing a process for treating a semiconductor substrate, according to one or more embodiments.

In describing the disclosed one or more embodiment processes, one may better appreciate the aspects of the processes by referencing FIGS. 2A-2I and 3 in coordination with one another. FIG. 3 is a process flow diagram representing a process for treating a semiconductor substrate. FIGS. 2A-2I are schematic drawings of several side cross-sectional views of a semiconductor substrate undergoing a process for forming a MEOL contact structure within portion of a semiconductor substrate. FIG. 1 illustrates a schematic representation of a processing system that may be adapted to perform one or more of the processes described in relation to FIGS. 2A-2I and 3.

Processing System Example

FIG. 1 illustrates a schematic representation of a processing system 100 for use with one or more embodiments of the disclosure. In one or more embodiments, the processing system 100 may be utilized to perform all or a portion of the process flow diagram 3000 of FIG. 3.

As detailed below, substrates in the processing system 100 may be processed in and transferred between the various chambers without exposing the substrates to an ambient environment exterior to the processing system 100 (for example, an atmospheric ambient environment such as may be present in a fab). For example, the substrates may be processed in and transferred between the various chambers maintained at a low pressure (for example, less than or equal to about 300 Torr) or sub-atmospheric pressure, such as a vacuum environment, without breaking the reduced relative pressure or vacuum environment among various processes performed on the substrates in the processing system 100. Accordingly, the processing system 100 may provide for an integrated solution for some processing of substrates.

Examples of a processing system that may be suitably modified in accordance with the teachings provided include the Endura®, Producer® or Centura® integrated processing systems or other suitable processing systems commercially available from Applied Materials, Inc., located in Santa Clara, California (CA), United States of America. One may envision that other processing systems, including those from other manufacturers, may be adapted to benefit from aspects described.

FIG. 1 is a schematic top view of the substrate processing system 100 (also referred to as a "processing platform"), according to embodiments described herein. The substrate processing system 100 generally includes an equipment front-end module (EFEM) 102 for loading substrates into the processing system 100, a first load lock chamber 104 coupled to the EFEM 102, a transfer chamber 108 coupled to the first load lock chamber 104, and a plurality of other chambers coupled to the transfer chamber 108 as described in detail below. The EFEM 102 generally includes one or more robots 105 that are configured to transfer substrates from the front opening unified pods (FOUPs) 103 to at least one of the first load lock chamber 104 or the second load lock chamber 106. Proceeding counterclockwise around the transfer chamber 108 from the buffer portion 108A of the first load lock chamber 104, the processing system 100 includes a first dedicated degas chamber 109, a first pre-clean chamber 110, a first pass-through chamber 112, a second pass-through chamber 113, a second pre-clean chamber 114, a second degas chamber 116 and the second load lock chamber 106. The buffer portion 108A of the transfer chamber 108 includes a first robot 115 that is configured to transfer substrates to each of the load lock chambers 104, 106, the degas chambers 109, 116, the pre-clean chambers 110, 114 and the pass-through chambers 112, 113.

The back-end portion 108B of the transfer chamber 108 includes a second robot 135 that is configured to transfer substrates to each of the pass-through chambers 112, 113 and the processing chambers coupled to the back-end portion 108B of the processing system 100. The processing chambers can include a first processing chamber 132, a second processing chamber 134, a third processing chamber 136, a fourth processing chamber 138 and a fifth process chamber 140. In general, the processing chambers 132, 134, 136, 138, 140 can include at least one of an atomic layer deposition (ALD) chamber, chemical vapor deposition (CVD) chamber, physical vapor deposition (PVD) chamber, etch chamber, degas chamber, an anneal chamber, and other type of semiconductor substrate processing chamber. In some embodiments, one or more of the processing chambers 132, 134, 136, 138, 140 are a PVD chamber. In some examples, the processing chamber 110 may be capable of performing an etch process, the processing chamber 114 may be capable of performing a cleaning process or an annealing process, and the processing chambers 132, 134, 136, 138, 140 may be capable of performing respective CVD or ALD deposition processes. In one example, the processing chamber 110 or 114 may be a Selectra™ Etch chamber available from Applied Materials of Santa Clara, Calif. In one example, the processing chamber 110 or 114 may be a SiCoNi™ Pre-clean chamber available from Applied Materials of Santa Clara, Calif. In one example, the processing chambers 132, 134, 136, 138, or 140 may be a Volta™ CVD/ALD chamber, or Encore™ PVD chambers available from Applied Materials of Santa Clara, Calif.

The buffer portion 108A and back-end portion 108B of the transfer chamber 108 and each chamber coupled to the transfer chamber 108 may be maintained at a vacuum state. As used herein, the term "vacuum" may refer to pressures less than 760 Torr, and will typically be maintained at pressures near $10^{-5}$ Torr (that is, ~$10^{-3}$ Pa). However, some high-vacuum systems may operate below near $10^{-7}$ Torr (that is, ~$10^{-5}$ Pa). In certain embodiments, the vacuum is created using a rough pump and/or a turbomolecular pump coupled to the transfer chamber 108 and to each of the one or more process chambers (for example, process chambers 109-140). However, other types of vacuum pumps are also contemplated.

A system controller 126, such as a programmable computer, is coupled to the processing system 100 for controlling one or more of the components therein. For example, the system controller 126 may control the operation of one or more of the processing chambers, such as processing chambers 132, 134, 136, 138, 140. In operation, the system controller 126 enables data acquisition and feedback from the respective components to coordinate processing in the processing system 100.

The system controller 126 includes a programmable central processing unit (CPU) 126A, which is operable with a memory 126B (for example, non-volatile memory) and support circuits 126C. The support circuits 126C (for example, cache, clock circuits, input/output subsystems, power supplies, etc., and combinations thereof) are conventionally coupled to the CPU 126A and coupled to the various components within the processing system 100.

In some embodiments, the CPU 126A is one of any form of general purpose computer processor used in an industrial setting, such as a programmable logic controller (PLC), for controlling various monitoring system component and sub-processors. The memory 126B, coupled to the CPU 126A, is non-transitory and is typically one or more of readily available memory such as random access memory (RAM), read only memory (ROM), floppy disk drive, hard disk, or any other form of digital storage, local or remote.

Herein, the memory 126B is in the form of a computer-readable storage media containing instructions (for example, non-volatile memory), that when executed by the CPU 126A, facilitates the operation of the processing system 100. The instructions in the memory 126A are in the form of a program product such as a program that implements the methods of the present disclosure (for example, middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. The various methods disclosed herein may generally be implemented under the control of the CPU 126A by the CPU 126A executing computer instruction code stored in the memory 126B (or in memory of a particular processing chamber) as, for example, a software routine. When the computer instruction code is executed by the CPU 126A, the CPU 126A controls the chambers to perform processes in accordance with the various methods.

As will be described further below, in one or more embodiments of the process 3000 described herein, all of the processes are performed under vacuum within the processing system 100. In one example, process 3004 is performed in chamber 110, process 3006 is performed in chamber 114, process 3008 is performed in chamber 132, process 3010 is performed in chamber 134, process 3012 is performed in chamber 136, process 3014 is performed in chamber 138, and processes 3016 and 3018 are performed in chamber 340. In another example, process 3004 is performed in chamber 110, process 3006 is performed in chamber 114, process 3008 is performed in chamber 110, process 3010 is performed in chamber 110, process 3012 is performed in chamber 132, process 3014 is performed in chamber 134, process 3016 is performed in chamber 136, and processes 3018 is performed in chamber 138. In another example, processes 3004, 3006 and 3008 are each performed in chamber 110 or 114, process 3010 is performed in chamber 132, and process 3012 is performed in chamber 134, and process 3014, 3016 and 3018 are each performed in either chamber 136, 138 or 140. In yet another example, processes 3004, 3006, 3008, 3010 and 3012 are each performed in one of the chambers 110 or 114, and processes 3014, 3016 and 3018 are performed in one of the chambers 132, 134, 136, 138 or 140.

Substrate Processing Sequences

Referring back to FIG. 3, process 3000 illustrates a process of providing a semiconductor substrate with an untreated contact junction as described in process 3002 for treatment. In the context of this disclosure, "untreated" in relation to the contact junction of the semiconductor substrate means that the contact junction has not been previously treated utilizing a process as disclosed. The semiconductor substrate and its one or more contact junction may have been previously treated by one or more prior processes in the production of the semiconductor substrate and contact junctions.

FIGS. 2A-2I are schematic drawings 2000 of several side cross-sectional views of a semiconductor substrate undergoing a process for treating the semiconductor substrate. A representation of an untreated contact junction 2002 formed on a semiconductor substrate 200 is shown in FIG. 2A. Substrate 200 has an upper surface or field region 202. A device feature 210 of a plurality of device features (not shown) are defined within the semiconductor substrate 200 and are formed within the field region 202. Such features may include a device feature 210 in which the field region 202 in part defines an upper boundary of the device feature 210. Based upon the configuration of substrate 200, the bounds of device feature 210 also include feature sidewalls 212 and feature bottom 214. As may be seen in untreated contact junction 2002, the feature bottom 214 is defined by two different regions: an exposed portion of a silicon-containing contact 220 and an adjacent portion of the substrate surface, which in some cases may include a dielectric material.

In one or more embodiments, the adjacent portion of the substrate surface that is proximate to the silicon-containing contact 220 may be comprised of a dielectric material, such as silicon dioxide ($SiO_2$), silicon nitride ($Si_3N_4$), a low-k dielectric material, or some other suitable material. In this instance, the substrate at the bottom of the device feature not occupied by the exposed portion of the silicon-containing contact 220 may include silicon dioxide, whereas the substrate defining the sidewalls may include silicon nitride ($Si_xN_y$).

The silicon-containing contact, such as silicon-containing contact 220, may include a material useful for forming a contact, such as a silicon-based material or a material contain silicon, such as a silicon/germanium (SiGe)-based material. One or more of the silicon-containing contacts 220 may additionally or alternately include a material that includes a dopant atom, such as an n-type or p-type dopant.

In regards to the sidewalls of the feature, such as feature sidewalls 212 illustrated in FIG. 2A, a portion of the substrate 200 may have been previously modified such that the sidewalls include a silicon nitride ($Si_3N_4$) on their surface. The silicon nitride ($Si_3N_4$) material may be formed over a first dielectric material, such as silicon dioxide ($SiO_2$), by use of a conventional plasma nitridation process. In one or more embodiments, which may be combined with other embodiments, the silicon nitride sidewall liner may have a thickness in a range of from about 1 to 5 nanometers (nm), such as from about 1, 1.5, 2, and 2.5 to 3, 3.5, 4, 4.5, and 5 nm, including the endpoint values and all values in between.

The silicon nitride region formed along the sidewalls of the device feature is referred to as a "sidewall liner", such as sidewall liner 230, to differentiate the silicon nitride comprising portion of the sidewalls from the remainder of the underlying material (for example, a silicon dioxide material). In one or more embodiments, which may be combined with other embodiments, a conventional plasma nitridation process used to form the sidewall liner includes inhibition or removal of a portion of the nitrided surface of the feature, such as at the bottom of the feature, by use of a chemical etch process with bias during the nitridation process so that the silicon nitride layer substantially remains on the feature sidewalls but not on the bottom of the feature. In the alternative, a conformal deposition of silicon nitride followed by an etch process to open structure bottom may also be utilized to obtain a similar resultant.

In one or more embodiments, which may be combined with other embodiments, the width of the device feature on the substrate is equal to or less than about 35 nanometers (nm), such as in a range of from about 5 to 35 nm, such as from about 5, 10, and 15 to 20, 25, 30, and 35 nanometers, including the endpoint values and all values in between. In one or more embodiments, which may be combined with other embodiments, the depth of the device feature on the substrate is equal to or greater than about 50 nm, such as in a range of from about 50 nm, such as from about 50, 75, 100, and 200 to about 300, 400, 500, 600, 700, 800, 900, or 1000 nm, including the endpoint values and all values in between.

In FIG. 2A, untreated contact junction 2002 also illustrates a surface contamination being present on the boundary surfaces of the device feature. The surface contaminant 240, such as native oxides, may be formed on one or more of the surfaces of the device feature, such as a silicon dioxide formed on all exposed surfaces. The surface contaminants may also be of varying thickness depending on the circumstances of formation, such as exposure to the atmosphere or oxygen while the substrate was at an elevated temperature. A thin film or layer of the surface contaminant 240 is shown in FIG. 2A on the surfaces of the feature sidewalls 212 and the silicon-containing contact 220.

In FIG. 3, process 3000 continues by showing that the semiconductor substrate with the untreated contact junction is cleaned a first time by the process 3004. The cleaning process performed during process 3004 may be performed in a process chamber, such as processing chamber 110 or 114 within the processing system 100. As a result of the first cleaning, the native oxides in the device feature of the semiconductor substrate are converted into cleaning process reaction product, which may include a silica salt hydrate containing material, forming a first-cleaned contact junction.

In FIG. 2B, a resultant first-cleaned contact junction 2004 is schematically represented. The native oxide layer 240 of untreated contact junction 2002 has been converted into a reaction product layer 250, or simply referred to as the product layer 250. The product layer 250 covers all of the device feature 210 surfaces, including the feature bottom 214 that comprises an exposed portion of the substrate 200. The first cleaning process converts all of the exposed silicon oxide containing material, including any semiconductor substrate silicon dioxide exposed within the device feature, into a cleaning process reaction product material that will include a silica salt hydrate containing material, which for the purposes of simplicity is referred to in the remainder of this application as simply "silica salt".

In one or more embodiments, which may be combined with other embodiments, the first cleaning process, such as first cleaning process 3004, includes utilizing an etching process, such as an ammonium fluoride etching process. Both ammonium fluoride and ammonium hydrogen fluoride are reactive with silicon oxides at in range of from about −30° C. to about 100° C. using a dry etching process versus other silicon-containing materials. For the purposes of this disclosure, utilizing either or both ammonium fluoride ($NH_4F$) or ammonium hydrogen fluoride ($NH_4F \cdot HF$) are collectively referred to as "ammonium fluoride". As well, the use of either or both ammonium fluoride or ammonium hydrogen fluoride in an etching process is referred to as the "ammonium fluoride etching process".

In one or more embodiments, which may be combined with other embodiments, the first cleaning process, such as first cleaning process 3004, includes generating a plasma formed with a carrier gas. The plasma/carrier gas combination may then be introduced to the surface of the semiconductor substrate with or without bias. In one or more embodiments, which may be combined with other embodiments, the carrier gas may comprise, consist, or consist essentially of a noble gas, such as argon, neon, and helium, and combinations thereof.

In one or more embodiments, which may be combined with other embodiments, the first cleaning process, such as first cleaning process 3004, includes introducing both a hydrogen-containing precursor and a fluorine-containing precursor into the plasma/carrier gas. For example, ammonia ($NH_3$) may be the hydrogen-containing precursor and nitrogen trifluoride ($NF_3$) may be the fluorine-containing precursor introduced into the plasma/carrier gas mixture. The introduction of both the hydrogen-containing precursor and the fluorine-containing precursor into the plasma/carrier gas causes both precursors to become energized on a molecular level. In such an energized states, disassociation of the precursors occurs in the carrier gas, forming a first plasma-disassociated hydrogen-containing precursor and a first plasma-disassociated fluorine-containing precursor. The dissociated atomic species then recombine in the carrier gas (gas phase) to form one or both ammonium fluoride ($NH_4F$) or ammonium hydrogen fluoride ($NH_4F \cdot HF$) species.

A variety of precursors may be utilized to create the ammonium fluoride species described. Another fluorine-containing precursor may be used to augment or replace nitrogen trifluoride. Examples of other useful fluorine-containing precursors include, but are not limited to, hydrogen fluoride (HF), molecular fluorine, atomic fluorine, and fluorine-substituted hydrocarbons. Similarly, a hydrogen-containing precursor may be used to augment or replace ammonia. Hydrogen-containing precursors may include one or more of atomic hydrogen and molecular hydrogen. In one or more embodiments, molecular hydrogen supplements the hydrogen-containing precursor to facilitate the formation of the ammonium fluoride species. The molecular hydrogen may disassociate into hydronium radicals ($H^*$) and hydrogen ions ($H^+$) in the plasma/carrier gas. In one or more embodiments, which may be combined with other embodiments, the introduced hydrogen-containing precursor may be fluorine-free. In one or more embodiments, which may be combined with other embodiments, the introduced fluorine-containing precursor may be hydrogen-free.

In one or more embodiments, which may be combined with other embodiments, the combined flow rates of hydrogen-containing and fluorine-containing precursors are in a range of from about 1 volume percent (vol. %) to 70 vol. % of the overall gas mixture, including the endpoint values and all values in between, whereas the remainder of the gas mixture comprises, consists, or consists essentially of the carrier gas. In one or more embodiment, which may be combined with other embodiments, a purge or carrier gas is first introduced into a plasma-generating region before the reactive gases are provided.

In one or more embodiments, which may be combined with other embodiments, the first cleaning process, such as cleaning process 3004, includes maintaining an etching rate of the ammonium fluoride etching process based upon the ratio of hydrogen-containing precursor to fluorine-containing precursor. A greater amount of fluorine-containing precursor to hydrogen-containing precursor will produce an ammonium fluoride etchant with relatively greater reactivity. In one or more embodiments, which may be combined with other embodiments, the molar ratio of hydrogen-containing precursor to fluorine-containing precursor introduced is in a range of from about 1:3 to 3:1, such as from about 1:3, 1:2.5, 1:2, 1:1.5 or 1:1 to about 1.5:1, 2:1, 2.5:1, or 3:1, including the endpoint values and all values in between. The molar ratio of hydrogen-containing precursor to fluorine-containing precursor in the etching gas mixture may be set to uniformly remove silicon oxides from all types of different semiconductor substrate trench junction surfaces.

The total amount reactive gas introduced may be provided to accommodate, for example, the thickness of the native oxide layer to be removed, the geometry of the semiconductor substrate being cleaned, the volume capacity of the plasma/carrier gas, the volume of ammonium fluoride to be formed, and the pressure under which the ammonium fluoride is introduced to the semiconductor substrate.

In one or more embodiments, which may be combined with other embodiments, the first cleaning process, such as the first cleaning process 3004, further comprises maintaining the semiconductor substrate at a first deposition temperature. The first deposition temperature permits the ammonium fluoride etchant to condense out of the plasma/carrier gas and deposit as a solid into the device feature, including along the feature sidewalls and feature bottom. In one or more embodiments, the first deposition temperature may be at a value that prevents substantial reaction of the deposited ammonium fluoride etchant with the native oxides present during deposition. The semiconductor substrate temperature may then be raised after deposition to facilitate regulation of the rate of reaction of the deposited ammonium fluoride etchant. In one or more embodiments, the first deposition temperature may be at a value where the ammonium fluoride etchant is deposited on the semiconductor substrate surfaces and immediately or near-immediately reacts with the silicon oxides present on the surfaces. The first deposition temperature may depend on other process conditions, such as the pressure around the semiconductor substrate. In one or more embodiments, which may be combined with other embodiments, the semiconductor substrate may be maintained at a first deposition temperature of less than 120° C., such as in a range of from about −30° C. to 120° C., such as from about −30° C., −20° C., −10° C., 0° C., 10° C., 20° C., 30° C., 40° C., 50° C., and 60° C. to 70° C., 75° C., 80° C., 85° C., 90° C., 95° C., 100° C., 105° C., 110° C., 115° C., and 120° C., and such as in a range of from about 0° C. to 75° C., including the endpoint values and all values in between.

Upon reaction between the ammonium fluoride etchant and the native oxides, a silica salt forms. In one example of a silica salt that is formed, an ammonium hexafluorosilicate hydrate (($NH_4$)$_2SiF_6 \cdot H_2O$) is present on the surfaces of the semiconductor substrate as a reaction product that is resultant where native oxide layers and bare silicon dioxide are present, such as shown in first-cleaned contact junction 2004 in FIG. 2B. Depending on the ratios of reactants introduced into the carrier gas/plasma, water, molecular hydrogen, and ammonia may also be present in the gas phase with the carrier gas.

In FIG. 3, process 3000 continues by showing that the semiconductor substrate with the first-cleaned contact junction is annealed a first time by use of an annealing process 3006. A first annealing process may be used to degrade the silica salt into vaporizable chemical constituents. In one or more embodiments, which may be combined with other embodiments, the first annealing process, such as the first annealing process 3006, comprises maintaining the semiconductor substrate at a first annealing temperature. The semiconductor substrate is heated to a greater temperature than the first deposition temperature in order to degrade the silica salt and sublime the degradation products from the surfaces of the semiconductor substrate. Although not wanting to be bound by theory, at least part of the silica salt are believed to break down into smaller compounds, such as water, ammonia, hydrogen fluoride, and silicon tetrafluoride, and then sublimate those products from the surfaces into the vapor state. The first annealing temperature may depend on other process conditions, such as the pressure around the semiconductor substrate. As pressure decreases, such as under sub-atmospheric pressure conditions (that is, partial vacuum), the silica salt decomposition products may be removed at comparatively reduced temperatures than performing the same operation at atmospheric pressure conditions. In one or more embodiments, the semiconductor substrate is maintained at an first annealing temperature of greater than about 75° C., such as in a range of from about 75° C. to 250° C., such as from about 75° C., 80° C., 85° C., 90° C., 95° C., 100° C., 105° C., 110° C., 115° C., 120° C., 130° C., 140° C., 150° C., 160° C., 170° C., or 180° C. to about 190° C., 200° C., 210° C., 220° C., 230° C., 240° C., or 250° C., including the endpoint values and all values in between. In one or more embodiments, the duration of annealing at the annealing temperature may be in a range of from about 45 to 120 seconds, such as from about 45, 60, 75, or 90 to about 105 or 120 seconds, including the endpoint values and all values in between. The period may include the time taken to heat the semiconductor substrate from the first deposition temperature to the first annealing temperature.

As a result of the first annealing, the silica salts are removed, forming a first-annealed contact junction on the semiconductor substrate. In FIG. 2C, a resultant first-annealed contact junction 2006 is schematically represented. The silica salts that were on the surfaces of the feature sidewalls 212 and feature bottom 214 of the first-cleaned contact junction are no longer present in the device feature 210 of the first-annealed contact junction 2006. In some cases, there is also a smaller native oxide layer 242 (less thick than the native oxide layer 240) that has formed on the exposed portion of the silicon-comprising contact 220. In some instances, there also may be a small amount of native oxide layer on the feature sidewalls 212.

In one or more embodiments, in which may be combined with other embodiments, the annealing process, such as the annealing process 3006, includes introducing an inert gas to the semiconductor substrate to evacuate the volatile products from the semiconductor substrate. In the context of this disclosure, an "inert gas" is a gas that does not oxidize the silicon-containing contact, for example, a noble gas, such as argon. In one or more embodiments, in which may be combined with other embodiments, the introduced inert gas may have an elevated temperature, such as in a range of from about 100° C. to 150° C., such as from about 100° C., 110° C., 120° C., and 130° C. to 140° C., and 150° C., including the endpoint values and all values in between. The heated inert gas flowing over the semiconductor substrate during and after treatment may facilitate in both the degradation and sublimation of the silica salt into the previously-described smaller, volatile compounds that thereafter sublime or evaporate.

In one or more embodiments, in which may be combined with other embodiments, the inert gas to remove volatile products is in the form of a low energy plasma. In such instances, utilizing a low energy plasma, such as a noble gas plasma, such as an argon plasma, may enhance both the sublimation and degradation rates of the silica salt material. In some instances where both a low energy plasma and the substrate is heated to greater than the sublimation temperature of the silica salt, is believed that the activation energy for sublimation can be reduced. For example, a layer of $(NH_4)_2SiF_6$ may be of a certain thickness that requires a temperature of 120° C. over a certain period of time to sublimate; however, by also introducing a low energy plasma along with heating the semiconductor substrate, the silica salt layer may sublimate at temperature of 100° C. over the same time period or at 120° C. for a shorter time period.

In one example, the annealing process 3006 is performed in a process chamber (for example, processing chamber 132, 134, 136, 138, or 140) within the processing system 100. In one or more embodiments, which may include other embodiments, the annealing process is performed at a temperature in a range of from about 70° C. to 150° C., such as from about 70, 75, 80, 85, 90, 95, 100, 105, 110, or 115° C. to about 120, 125, 130, 135, 140, 145, or 150° C., including the endpoint values and all values in between. In one or more embodiments, which may include other embodiments, the annealing process is maintained at a pressure in a range of from about 1 to 1000 mTorr (milliTorr), such as from about 1, 2, 5, 10, 20, 30, 50, 75, 100, 200, 300, 400, or 500 to about 600, 700, 800, 900, 950, or 1000 mTorr, including the endpoint values and all values in between. In one or more embodiments, which may include other embodiments, the annealing process is maintained for a period in a range of from about 30 to 150 seconds, such as from about 30, 45, 60, or 75 to about 90, 105, 120, 135, or 150 seconds, including the endpoint values and all values in between.

In one or more embodiments, which may include other embodiments, the first cleaning process and the first annealing process occur in the same chamber. In doing so, the amount of oxidation and exposure to an external atmosphere may be minimized. Reducing exposure to oxidizing agents at this stage of the process may make the first cleaning and annealing processes more effective than if the semiconductor substrate was transferred between two different processing chambers.

In FIG. 3, process 3000 shows an optional return to first cleaning operation 3005. A determination may be made utilizing an automated, a partially automated, or a manual system as to whether to return the now at least partially treated semiconductor substrate contact junction to the prior first cleaning process 3004 or to advance the same to the second cleaning process 3008. Such a determination may rely in part upon an evaluation of whether there is a desired thickness or even a presence of native oxides on the upper surface of the silica-containing contact. The determination may also evaluate the presence or lack thereof of native oxides along the trench sidewall portion of the annealed contact junction. If the determination finds that there is still too much native oxides remaining, the process 3000, may loop back to the first cleaning process 3004. After such a determination, the semiconductor substrate may begin a cooling process to achieve the first deposition temperature at the start of the first cleaning process 3004. In one or more embodiments, which may include other embodiments, the process, such as process 3000, loops between a first cleaning process, such as first cleaning process 3004, and an annealing process, such as the annealing process 3006, one or more times, such as one, two, three, four, five, six, seven, eight, nine, and 10 times, to achieve the desired results.

In one or more embodiments, which may include other embodiments, the process, such as process 3000, advances towards second cleaning process, such as second cleaning process 3008, without optionally looping back, that is, the process does not loop back to the first cleaning process and annealing but rather proceeds directly to the second cleaning process from the annealing.

In FIG. 3, process 3000 continues by showing that the semiconductor substrate with the first annealing contact junction is cleaned a second time 3008. In one or more embodiments, which may include other embodiments, the second cleaning process, such as second cleaning process 3008, utilizes an ammonium fluoride etching process. In one or more embodiments, which may include other embodiments, the second cleaning process, such as second cleaning process 3008, utilizes similar conditions as the first cleaning process, such as first cleaning process 3004, including, but not limited to, the use of ammonium fluoride etching precursors, the carrier gas, forming a plasma, the conditions of deposition of the etchant, and the reaction of the ammonium fluoride on the surfaces of the semiconductor substrate. In one or more embodiments, which may include other embodiments, the second cleaning process does not occur at similar conditions as the first cleaning process.

In one or more embodiments, which may include other embodiments, the second cleaning process, such as second cleaning process 3008, includes introducing both a hydrogen-containing precursor and a fluorine-containing precursor into the plasma/carrier gas. For example, ammonia ($NH_3$) may be the hydrogen-containing precursor and nitrogen trifluoride ($NF_3$) may be the fluorine-containing precursor introduced into the plasma/carrier gas. The introduction of both the hydrogen-containing precursor and the fluorine-containing precursor into the plasma/carrier gas causes both precursors to become energized on a molecular level such that disassociation occurs in the carrier gas, forming a second plasma-disassociated hydrogen-containing precursor and a second plasma-disassociated fluorine-containing precursor.

In one example, the second cleaning process 3008 is performed in a process chamber (for example, processing chamber 132, 134, 136, 138, or 140) within the processing system 100. In one or more embodiments, which may include other embodiments, during the second cleaning process the semiconductor substrate is maintained is maintained at a temperature in a range of from about −30° C. to 70° C., such as about −30° C., −20° C., −10° C., 0° C., 10° C., 20° C. or 30° C. to about 40° C., 50° C., 60° C., or 70° C., including the endpoint values and all values in between. In one or more embodiments, which may include other embodiments, the second cleaning process is maintained at a pressure in a range of from about 50 mTorr to 1000 mTorr, such as from 50, 75, 100, 200, 300, 400, or 500 to about 600, 700, 800, 900, 950, or 1000 mTorr, including the endpoint values and all values in between. In one or more embodiments, which may include other embodiments, the second cleaning process is maintained for a period in a range of from about 1 second to 60 seconds, such as from about 1, 2, 3, 4, 5, 7, 9, 10, 15, 20, 25, or 30 to about 35, 40, 45, 50, 55, or 60 seconds, including the endpoint values and all values in between.

In one or more embodiments, which may include other embodiments, the first cleaning process and the second cleaning process occur in the same chamber. In one or more embodiments, which may include other embodiments, the first cleaning process and the second cleaning process occur in different chambers.

As may be appreciated in FIG. 2D, the second-cleaned contact junction 2008 shows a resultant silica salt layer 252 on top of the silicon-containing contact 220 as well as on the portion of the feature bottom 214 where the exposed silicon oxide portion of the substrate 200 is exposed within the device feature 210.

In one or more embodiments, which may be combined with other embodiments, process 3000 continues by showing that a semiconductor substrate with the second cleaned substrate and feature are passivated by use of a passivation process 3010. As a result of the passivation process 3010, at least a portion of the sidewalls are oxidized and converted from silicon nitride ($Si_xN_y$) to a silicon oxynitride ($Si_xO_zN_y$). The silica salt formed over at least the silicon-containing contact 220 is unaffected by the passivation process.

In FIG. 2E, a resultant passivated liner contact junction 2010 is schematically represented. At least a portion of the semiconductor substrate is exposed to the oxygen reactant and is oxidized. The remaining portion of the semiconductor substrate, especially the silicon-containing contact, is not oxidized because it is protected by the silica salt. The silica salts on the feature bottom 214 remain after the passivation treatment. At least a portion of the silicon nitride ($Si_3N_4$) is converted to silicon oxynitride ($Si_xO_zN_y$) during passivation. Silicon oxynitride ($Si_xO_zN_y$) is a material that is stable and resistant to further oxidation. Although not wanting to be bound by theory, it is believed that the formed silicon oxynitride material is also selective towards cation deposition, such as metal cations, preventing them from bonding and forming on the surface of the silicon oxynitride regions on the substrate, and thus preventing these regions from acting as base or seed material for metal layer growth. This configuration thus permits selective deposition of metals on other cation-receptive materials found within different regions of the feature.

In one or more embodiments, which may be combined with other embodiments, a semiconductor substrate comprises a partially treated contact junction. The semiconductor substrate defines a feature bottom, a feature sidewall, a field, and a device feature for the partially treated contact junction. The feature bottom comprises a partially-exposed silicon-containing contact having a protective silica salt layer on top of the silicon-containing contact between the top of the silicon-containing contact and the device feature. The feature sidewall comprises a sidewall liner in contact with the device feature further comprising a silicon oxynitride. In one or more embodiments, the sidewall liner in contact with the device feature further comprises a silicon nitride.

In one or more embodiments, which may be combined with other embodiments, the passivation process, such as passivation process 3010, comprises exposing the semiconductor substrate having the silica salts positioned on top of the silicon-containing contact to an oxidizing agent. In one or more embodiments, which may be combined with other embodiments, which may be combined with other embodiments, the oxidizing agent is a chemical oxidizer, such as ozone ($O_3$) or a peroxide, such as an inorganic peroxide, like hydrogen peroxide, or an organic peroxide. In one or more embodiments, which may be combined with other embodiments, the oxidizer is an oxygen-based plasma. In providing an oxygen-based plasma, the oxidizing agent is plasma-disassociated oxygen.

Whether in chemical or plasma form, the oxidizing agent reacts with any exposed dielectric surfaces, such as the silicon nitride-comprising feature sidewalls of the second cleaned contact junction 2008. This oxidation reaction with silicon nitride ($Si_3N_4$) creates a protective silicon oxynitride layer 260 on the sidewall liners 230 of the feature sidewalls 212. The entire surface of the sidewall liner that is exposed to the oxidizing agent is passivated to some degree. In one or more embodiments, which may be combined with other embodiments, the depth of passivation of the silicon nitride sidewall liner is in a range of from about 3 to 30 Angstroms (Å) (about 0.3 to 3 nm), such as from 3, 4, 5, 6, 7, 8, 9, or 10 to about 12, 15, 18, 20, 23, 25, 27, or 30 Å, including the endpoint values and all values in between. In one or more embodiments, which may be combined with other embodiments, the depth of passivation in relation to the depth of the sidewall liner is in a range of from about 6 to 100 percent of the depth of the sidewall liner, such as from 6, 7, 8, 9, 10, 15, 20, 25, 30, 40, 45, or 50 to about 55, 60, 65, 70, 75, 80, 85, 90, 95, 96, 97, 98, 99, 99.9, 99.99, or about 100% of the depth of the sidewall liner, including the endpoint values and all values in between.

In one or more embodiments, which may be combined with other embodiments, the oxidizing agent comprises, consists, or consists essentially of a plasma-disassociated oxidizing agent. In one or more embodiments, which may be combined with other embodiments, an oxygen feed comprises at least about 95 vol. % molecular oxygen ($O_2$), such as in a range of from about 95, 96, 97, 98, and 99 to 99.9, 99.99, 99.99, and about 100 vol. % molecular oxygen. Upon energization of the oxygen feed and formation of the plasma-disassociated oxidizing agent, although not wanting to be bound by theory, it is believed that atomic/ionic oxygen (O⁻), free-radical oxygen (O*), and energized molecular oxygen ($O_2$) are present in the oxygen-based plasma and interact with the exposed surfaces susceptible to oxidation. The balance of material in the oxidizing agent may include an inert or diluent material that does not interfere with the oxidizing process or the formation of a plasma, such as residual argon or other noble gases from an air separations process.

In one or more embodiments, which may be combined with other embodiments, the passivation process, such as the passivation process 2010, includes generating the oxygen-based plasma in a carrier gas that is performed in a process chamber, for example, processing chamber 132, 134, 136, 138, or 140 within the processing system 100. The plasma/carrier gas may then be introduced towards the surface of the semiconductor substrate. In one or more embodiments, which may be combined with other embodiments, the carrier gas comprises, consists, or consists essentially of a noble gas, such as argon, neon, and helium, and combinations thereof. In one or more embodiments, which may be combined with other embodiments, the passivation process, such as passivation process 2010, includes maintaining the temperature of the semiconductor substrate at an oxidization temperature. In one or more embodiments, which may be combined with other embodiments, during the passivation process the semiconductor substrate is maintained at a temperature in the range of from about −15° C. to 180° C., such as in a range of from about −15, −10, −5, 0, 5, 10, 15, 20, 25, 30, 35, 40, or 50 to about 60, 70, 80, 90, 100, 110, 120, 130, 140, 150, 160, 170, or 180° C., including the endpoint values and all values in between. In one or more embodiments, which may be combined with other embodiments, the passivation process is maintained for a period in a range of from about 10 seconds to 120 seconds, such as in a range of from about 10, 15, 30, 45, 60, or 75 to about 90, 105, or 120 seconds, including the endpoint values and all values in between. The period may include the time taken to adjust the semiconductor substrate from the second cleaning temperature to the oxidization temperature.

In one example, the passivation process includes exposing a radio frequency (RF) biased substrate to an oxygen containing RF plasma (for example, about 13.56 MHZ). In one or more embodiments, which may be combined with other embodiments, the semiconductor substrate is maintained at a temperature in a range of from about 20° C. to 40° C., including the endpoint values and all values in between. In one or more embodiments, which may be combined with other embodiments, the passivation process is maintained at a pressure in a range of from about 100 mTorr to 500 mTorr, such as in a range of from about 100, 150, 200, 250, or 300 to about 350, 400, 450, or 500 mTorr, including the endpoint values and all values in between. In one or more embodiments, which may include other embodiments, the passivation process is maintained for a period in a range of from about 10 seconds to 60 seconds, including the endpoint values and all values in between.

In FIG. 3, process 3000 continues by showing that the semiconductor substrate with the passivated contact junction is annealed for a second time 3012. As a result of the second annealing, the silica salts previously protecting the feature bottom, especially the silicon-containing contact, are removed. A second-annealed contact junction 2012 on the semiconductor substrate forms. In FIG. 2F, a resultant second-annealed contact junction 2012 is schematically represented. The silica salt is removed from the feature bottom 214, exposing the top of the silicon-containing contact 220. The sidewall liner 230 of the feature sidewalls 212 are at least coated if not completely passivated with an outer layer comprising the silicon oxynitride protection layer 260; this layer remains unaffected after the second annealing.

In one or more embodiments, which may be combined with other embodiments, a semiconductor substrate comprises a partially treated contact junction. The semiconductor substrate defines a feature bottom, a feature sidewall, a field, and a device feature for the partially treated contact junction. The feature bottom comprises a partially-exposed silicon-containing contact having no protective layer between the top of the silicon-containing contact and the device feature. The feature sidewall comprises a sidewall liner in contact with the device feature further comprising a silicon oxynitride. In one or more embodiments, the sidewall liner in contact with the device feature further comprises a silicon nitride.

In one example, the second annealing process 3012 is performed in a process chamber (for example, processing chamber 132, 134, 136, 138, or 140) within the processing system 100. In one or more embodiments, which may be combined with other embodiments, during the second annealing process the semiconductor substrate is maintained at a temperature in a range of from about 70° C. to 150° C., such as from about 70, 75, 80, 85, 90, 95, 100, 105, 110, or 115° C. to about 120, 125, 130, 135, 140, 145, or 150° C., including the endpoint values and all values in between. In one or more embodiments, which may be combined with other embodiments, the second annealing process is maintained at a pressure in a range of from about 1 mTorr to 1000 mTorr, such as in a range of from about 1, 2, 5, 10, 20, 30, 50, 75, 100, 200, 300, 400, or 500 to about 600, 700, 800, 900, 950, or 1000 mTorr, including the endpoint values and all values in between. In one or more embodiments, which may be combined with other embodiments, the second annealing process is maintained for a period in a range of from about 30 seconds to 150 seconds, such as in a range of from about 30, 45, 60, 75, 90, and 105 to 120, 135, and 150 seconds, including the endpoint values and all values in between. In one or more embodiments, which may be combined with other embodiments, the conditions of the first annealing process and the second annealing process are similar.

Various portions of the process may be performed in the same chamber as there are similar conditions (similar pressure, similar temperature) or a strong desire to prevent contamination of the substrate, such after annealing, which despite best efforts could occur during transfer from a first chamber to a second chamber. As previously described, the both cleaning steps may occur in the same chamber. As well, the first cleaning and the first annealing may occur in the same chamber. In one or more embodiments, which may be combined with other embodiments, the first annealing process and the second annealing process occur in the same chamber. In one or more embodiments, which may be combined with other embodiments, the first annealing process and the second annealing process occur in the same chamber. In one or more embodiments, which may be combined with other embodiments, the second cleaning, the passivation, and the second annealing may occur in the same chamber. In one or more embodiments, which may be combined with other embodiments, the first cleaning and the first annealing occur in a first chamber and the second cleaning, the passivation, and the second cleaning occur in a second chamber that is different than the first chamber.

In FIG. 3, process 3000 continues by showing that the semiconductor substrate with the second annealed contact junction undergoes a first metal deposition process 3014. In FIG. 2G, a first metal silicide layer (that is, first metal silicide-containing cap 270) is shown formed on top of the silicon-containing contact in the contact junction, forming a first metal silicide contact junction 2014. In one or more embodiments, the first metal utilized for the metal deposition process comprises titanium (Ti). In one or more embodiments, which may be combined with other embodiments, the first metal deposition process, such as first metal deposition process 3014, includes depositing the first metal, such as titanium, by any suitable chemical deposition technique, including but not limited to a CVD or ALD. In one or more embodiments, which may be combined with other embodiments, the first metal deposition process, such as first metal deposition process 3014, includes utilizing a plasma with a carrier gas. The plasma/carrier gas may then be introduced towards the surface of the semiconductor substrate. In one or more embodiments, which may be combined with other embodiments, the carrier gas comprises, consists, or consists essentially of a noble gas, such as argon, neon, and helium, and combinations thereof.

In FIG. 2G, a first metal silicide-containing cap 270 is selectively formed on top of the exposed portion of the silicon-containing contact 220. Although not wanting to be bound by theory, a first metal silicide-containing cap 270 is believed to form as an amalgamation of the first metal with silicon on top of the silicon-containing contact 220. For example, the first metal silicide-containing material may comprise titanium, substantially pure titanium, one or more titanium silicides (TiSi), and silicon (Si). A cap of titanium silicide, because it is an amalgam of titanium and silicon, may have at any given point a composition of $Ti_5Si_3$, $TiSi_2$, TiSi, and variations thereof, and combinations thereof, within, and will be referred to collectively as "titanium silicide" and more broadly as "metal silicide".

The first metal deposition process is selective to the silicon-containing contact over the dielectric material of the substrate, such as the exposed substrate 200 on the feature bottom 214. Although not wanting to be bound by theory, the selective metal silicide deposition process is believed to have a selectivity of silicon (Si) or silicon/germanium (SiGe) over silicon oxide ($SiO_2$) and silicon nitride ($Si_xN_y$) in a range of about from 1.5:1 to greater than 30:1. Although not wanting to be bound by theory, the selective metal silicide deposition process is believed to have a selectivity of silicon over silicon oxynitride ($Si_xO_zN_y$) in a range from about 2:1 to infinite selectivity. An "infinite selectivity" means that, for example, a metal silicide does not form on the silicon oxynitride ($Si_xO_zN_y$) at all, such as silicon oxynitride protection layer 260.

After deposition of the first metal and the formation of a metal silicide, the formerly-exposed portion of the silicon-containing contact is sealed by the metal silicide cap 270. In one or more embodiments, the thickness of the metal silicide-containing material layer formed on top of the silicon-containing contact may be in a range of from about 1 to 20 nm, such as in a range of from about 3 to 30 nm, such as in a range of from about 4 to about 25 nm, such as in a range of from about 5 to about 20 nm, and such as about 10 nm. In one or more embodiments, which may be combined with other embodiments, the thickness of the metal silicide-containing material layer on top of the silicon dioxide substrate may be in a range of from about 0.1 to 3 nm (about 1 to 30 Å).

In one or more embodiments, which may be combined with other embodiments, the first metal deposition process, such as first metal deposition process 3014, includes introducing a third hydrogen-containing precursor by utilizing a conductive coupled plasma (CCP) deposition. In one or more embodiments, which may be combined with other embodiments, the first metal deposition process 3014, such as first metal deposition process, includes introducing both a third hydrogen-containing precursor and a first metal-containing precursor into the plasma/carrier gas. In one or more embodiments, which may be combined with other embodiments, the first metal-containing precursor gas may be fluorine free to prevent formation of metal fluoride solids that have undesirable resistivity properties. In one or more embodiments, which may be combined with other embodiments, the first metal-containing precursor gas includes molecular hydrogen ($H_2$), which may be the third hydrogen-containing precursor, and titanium chloride ($TiCl_4$), which may be the first metal-containing precursor gas, are introduced into the plasma/carrier gas, forming a third plasma-disassociated hydrogen-containing precursor and a plasma-disassociated first metal-containing precursor. The introduction of both the third hydrogen-containing and the first metal-containing precursors into the plasma/carrier gas causes both precursors to become energized on a molecular level to a point of at least partial disassociation in the carrier gas. For example, titanium chloride may disassociate into titanium-based ions ($Ti^+$, $TiCl_x^+$) or free radial titanium trichloride ($TiCl_3^*$); hydrogen may disassociate into hydronium ions ($H^+$) or hydrogen free radicals ($H^*$). The dissociated species may then interact with the silicon surface of the silicon-containing contact, donate electrons to the silicon atoms and then each species interact with one another and form the amalgam titanium silicide layer on the top of the silicon-containing contact.

In one or more embodiments, which may be combined with other embodiments, the first metal deposition process, such as first metal deposition process 3014, comprises maintaining the semiconductor substrate at a first metal deposition temperature. In one or more embodiments, which may be combined with other embodiments, the semiconductor substrate is maintained at a metal deposition temperature in a range of from about 200 to 800° C., such as about 200, 300, 400, 450, or 500 to about 600, 700, or 800° C., including the endpoint values and all values in between. In one or more embodiments, which may be combined with other embodiments, the first metal deposition process is maintained for a period in a range of from about 5 to 20 seconds, such as from 10 to 15 seconds, including the endpoint values and all values in between. In one or more embodiments, which may be combined with other embodiments, the first metal deposition process, such as first metal deposition process 3014, may further comprise introducing an inert gas to the semiconductor substrate to evacuate the products from the metal deposition. In one or more embodiments, which may be combined with other embodiments, the introduced inert gas may have an elevated temperature, such as in a range of from about 100° C. to about 150° C., such as in a range of from about 100, 110, 120, or 125 to about 130, 140 or 150° C., including the endpoint values and all values in between. The inert gas flowing over the semiconductor substrate may facilitate in cooling and affixing the metal silicide on the top of the silicon-containing contact as well as removing of any volatilized products and unreacted materials, such as molecular hydrogen and hydrogen chloride (HCl).

In FIG. 3, process 3000 continues by showing that the semiconductor substrate with the first metal silicide contact junction has a second metal layer deposited onto the contact junction, by use of a second metal deposition process, such as second metal deposition process 3016. The conductive second metal-containing layer acts as the contact layer with the conductor metal to be introduced into the device feature.

In FIG. 2H, a second metal contact junction 2016 is schematically represented. In FIG. 2H, a resultant second metal-containing layer 280 is shown formed selectively on top of the top of the first metal silicide-containing cap 270. Although not shown in FIG. 2H, there may be de minimus amounts of the second metal containing layer formed on any first metal silicide material along the feature bottom that is not associated with the silicon-containing contact.

In one or more embodiments, which may be combined with other embodiments, the second metal deposition process, such as the second metal deposition process 3016, may include depositing a second metal, such as tungsten, onto the top of the first metal silicide-containing cap. Any suitable selective deposition process, including, but not limited to, CVD and ALD, may be utilized.

Conductive materials are useful in forming the second metal-containing layer as this layer will either be in direct contact with the conductor material filling the device feature or will become a component thereof. In one or more embodiments, which may be combined with other embodiments, the second metal-containing layer comprises, but is not limited to, one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), and iridium (Ir), and combinations thereof. In one or more embodiments, which may be combined with other embodiments, the second metal-containing layer comprises, consists, or consists essentially of tungsten. In one or more embodiments, the second metal-containing layer comprises, consists, or consists essentially of molybdenum.

As part of the process of depositing a second metal onto the contact junction during process 3016, both a second metal-containing precursor and a first reducing agent are introduced in the process chamber with a carrier gas. The gas mixture is then introduced towards the surface of the semiconductor substrate. In one or more embodiments, which may be combined with other embodiments, the carrier gas may comprise, consist, or consist essentially of a noble gas, such as argon, neon, and helium, and combinations thereof.

As part of the process of depositing a second metal onto the contact junction 3016, the semiconductor substrate may be maintained as a second metal deposition temperature. In one or more embodiments, which may be combined with other embodiments, the substrate, such as substrate 200, is maintained at a second metal deposition temperature in the range of from about 400° C. to 550° C., such as in a range from 400, 425, 450, 475, and 500 to 525 and 550° C., including the endpoint values and all values in between. In one or more embodiments, which may be combined with other embodiments, the temperature at which the semiconductor substrate is maintained during both the first metal deposition process and the second metal deposition process is the same. In one or more embodiments, which may be combined with other embodiments, the pressure at which the process is maintained during both the first metal deposition process and the second metal deposition process is the same. In one or more embodiments, which may be combined with other embodiments, the period in which the process is maintained during both the first metal deposition process and the second metal deposition process is the same. In one or more embodiments, which may be combined with other embodiments, both the first metal deposition process and the second metal deposition occur in the same process is the same chamber.

As noted previously, the second metal-containing layer 280 may be formed in part by using a selective deposition process that utilizes a second metal-containing precursor, such as a fluorine free second metal-containing precursor. In one or more embodiments, which may be combined with other embodiments, the introduced second metal-containing precursor comprises, consists, or consists essentially of a fluorine-free metal halide. For example, the second metal-containing precursor may comprises, consists, or consists essentially of a fluorine-free tungsten precursor (FFW). Examples of FFW halides include, but are not limited to, tungsten pentachloride ($WCl_5$) and tungsten hexachloride ($WCl_6$). In one or more embodiments, which may be combined with other embodiments, the fluorine-free tungsten precursor comprises, consists, or consists essentially of a tungsten oxyhalide precursor. Examples of a tungsten oxyhalide include, but are not limited to, tungsten oxytetrachloride ($WOCl_4$) and tungsten dichloride dioxide ($WO_2Cl_2$). In one or more embodiments, which may be combined with other embodiments, the fluorine-free tungsten precursor is also a chlorine-free tungsten precursor (CFW). Examples of a fluorine-free and chloride-free tungsten precursor includes, but is not limited to, tungsten pentabromide ($WBr_5$) and tungsten hexabromide ($WBr_6$). In one or more embodiments, which may be combined with other embodiments, the second metal-containing precursor comprises, consists, or consists essentially of fluorine-free metal organic, such as tris(3-hexyne) tungsten carbonyl (W(CO)($CH_3CH_2C \equiv CCH_2CH_3)_3$).

As part of the process of depositing a second metal onto the contact junction during the process 3016, a first reducing agent that is reactive with the second metal-containing precursor is introduced into the carrier gas along with the second metal-containing precursor. The first reducing agent may be a third hydrogen-containing composition, such as, but not limited to, molecular hydrogen ($H_2$), ammonia ($NH_3$), hydrazine ($N_2H_4$), silane ($SiH_4$), disilane ($Si_2H_6$), trisilane ($Si_3H_8$), and tetrasilane ($Si_4H_{10}$), and combinations thereof. The reducing agent acts as a proton donor to cause the second metal-containing precursor to form a metallic film comprising the second metal on top of the first metal silicide-containing cap.

The second metal-containing deposition process 3016 may include maintaining a flow rate of the second metal-containing precursor to a flow rate of the first reducing agent into the carrier gas until a second metal-based film forms on the first metal silicide-containing cap. In one or more embodiments, which may be combined with other embodiments, the second metal-containing precursor and the first reducing agent are introduced into the carrier gas at a molar ratio relative to one another in a range of from about 10:1 to 1:100, such as in a range from about 10:1, 5:1, 2:1, or 1:1 to about 1:2, 1:5, 1:10, 1:20, 1:50, or 1:100, including the endpoint values and all values in between. In one or more embodiments, which may be combined with other embodiments, the combined flow rates of second metal-containing precursor and first reducing agent are in a range of from about 1 vol. % to 70 vol. % of the overall gas mixture, including the endpoint values and all values in between, whereas the remainder of the gas mixture comprises, consists, or consists essentially of the carrier gas.

In one or more embodiments, which may be combined with other embodiments, the process of depositing a second metal onto the contact junction, such as process of depositing a second metal 3016, includes introducing an inert gas to the second metal deposited semiconductor substrate. The inert gas evacuates the carrier gas, reactants, and products from the metal deposition and reduction processes.

In FIG. 3, process 3000 continues by showing that the semiconductor substrate with the second metal contact junction, forming a completed contact junction by use of a process 3018. The conductor material is deposited on top of the second metal-containing layer and completely fills the device feature. In one or more embodiments, the process 3018 is simply an extension of the process 3016, and thus the process 3018 includes a selective deposition process that cause the device feature 210 to be completely filled with a conductive layer. In one example, the process 3018 includes a bottom-up selective process that comprises delivering a tungsten containing precursor (for example, tungsten hexafluoride ($WF_6$)) and a reducing agent (for example, $H_2$) to a surface of a substrate, while maintaining the substrate and processing region of the process chamber at a pressure of about 0.9 Torr to 300 Torr and a processing temperature of about 300° C. to about 550° C. In an alternate embodiment, the process 3018 is simply an extension of the process 3016, and thus the process 3018 is simply a process that causes the process 3016 to be performed multiple time, or causes the process 3016 to be performed for an extended period of time, to cause the device feature 210 to be completely filled with a conductive layer.

In FIG. 2I, a resultant completed contact junction 2018 is schematically represented. In FIG. 2I, a conductor material 282 is shown filling the device feature 210 up to the field region 202. The conductor material 282 is shown in contact with the second metal-containing layer 280 such that the conductor material is in electrical communication with the silicon-containing contact 220. The conductor material 282 is also in contact with the sidewall liner 230, which on at least the trench junction-facing surface still comprises the protective silicon oxynitride layer 260 insulating the semiconductor substrate.

In one or more embodiments, which may be combined with other embodiments, the conductor material filling process, including conductor material filling process 3018, includes depositing a conductor material, such as tungsten, onto the top of the second metal-containing layer. Any suitable chemical deposition process, including but not limited to CVD or ALD processes, may be utilized. The conductor material may be applied such that the material is deposited onto the bottom portion of the device feature and then grown upwards towards the semiconductor field region such that the resultant conductor material is at least level with the field region.

In one or more embodiments, which may be combined with other embodiments, the conductor material comprises, but is not limited to, one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), and iridium (Ir), and any combination thereof. In one or more embodiments, the conductor material comprises, consists, or consists essentially of tungsten. In one or more embodiments, the conductor material comprises, consists, or consists essentially of molybdenum.

In one or more embodiments, which may be combined with other embodiments, the conductor material comprises, consists, or consists essentially of the same material as the second metal-containing layer, such as second metal-containing layer 280. In such an instance, the second-metal-containing layer may merge with the conductor material and the separation between the two materials as shown in FIG. 2I may become indistinguishable.

As may be appreciated by one of ordinary skill in the art, one or more configurations of semiconductor substrates or other portions of the same semiconductor substrate and features, such as contact junctions, may benefit from the processes and methods described.

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems may generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperability coupled with a hardware processor configured to perform the computer-implemented method or the instructions stored on the non-transitory, computer-readable medium.

While the various steps in an embodiment method or process are presented and described sequentially, one of ordinary skill in the art will appreciate that some or all of the steps may be executed in different order, may be combined or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward", "horizontal", "vertical", and the like do not refer to absolute directions. Instead, these terms refer to directions relative to a nonspecific plane of reference. This non-specific plane of reference may be vertical, horizontal, or other angular orientation.

The singular forms "a," "an," and "the" include plural referents, unless the context clearly dictates otherwise. Within a claim, reference to an element in the singular is not intended to mean "one and only one" unless specifically so stated, but rather "one or more." Unless specifically stated otherwise, the term "some" refers to one or more.

Embodiments of the present disclosure may suitably "comprise", "consist" or "consist essentially of" the limiting features disclosed, and may be practiced in the absence of a limiting feature not disclosed. As used here and in the appended claims, the words "comprise," "has," and "include" and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

As used, the term "determining" encompasses a wide variety of actions. For example, "determining" may include calculating, computing, processing, deriving, investigating, looking up, for example, looking up in a table, a database or another data structure, and ascertaining. Also, "determining" may include receiving, for example, receiving information, and accessing, for example, accessing data in a memory. Also, "determining" may include resolving, selecting, choosing, and establishing.

When the word "approximately" or "about" are used, this term may mean that there may be a variance in value of up to ±10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f), for any limitations of any of the claims, except for those in which the claim expressly uses the words 'means for' together with an associated function.

The following claims are not intended to be limited to the embodiments provided but rather are to be accorded the full scope consistent with the language of the claims.

What is claimed is:

1. A method of forming a contact structure on a semiconductor substrate, comprising:
   removing material from surfaces of a feature formed in a field region surface of the semiconductor substrate, wherein
      removing the material forms a reaction product material over at least one of the field region surface and surfaces within the feature,
      the surfaces within the feature comprise sidewalls and a contact surface, and
      the surface of the sidewalls comprise silicon nitride;
   heating the substrate to a first annealing temperature to remove the reaction product material from the field region surface and the surfaces within the feature;
   selectively forming a silica salt layer over the contact surface after the reaction product material has been removed from at least the contact surface of the surfaces within the feature;
   exposing at least portion of the sidewalls and silica salt layer within the feature to a plasma that comprises an oxidizing agent;
   heating the substrate to a second annealing temperature thereby substantially removing the silica salt layer from the contact surface;
   forming a metal silicide layer on the contact surface, wherein forming the metal silicide layer on the contact surface comprises selectively depositing a first metal layer on the contact surface; and
   filling the feature with a metal, wherein filling the feature comprises selectively depositing a second metal layer on the formed metal silicide layer.

2. The method of claim 1, wherein exposing at least the portion of the sidewalls forms a silicon oxynitride material on the surface of the sidewalls.

3. The method of claim 2, wherein the exposing the at least portion of the sidewalls and silica salt layer within the feature to the plasma further comprises heating the substrate to a third temperature.

4. The method of claim 3, wherein forming the metal silicide layer on the contact surface further comprises heating the substrate to a third temperature.

5. The method of claim 1, wherein selectively depositing a first metal layer on the contact surface comprises introducing a hydrogen-containing precursor and a first metal-containing precursor to the contact surface such that a first metal layer forms on top of the contact surface that comprises silicon or silicon germanium.

6. The method of claim 1, wherein selectively depositing a second metal layer on the formed metal silicide layer comprises introducing a first reducing agent and a second metal-containing precursor to the surface metal silicide layer.

7. The method of claim 1, wherein silica salt layer comprises an ammonium hexafluorosilicate.

8. The method of claim 1, wherein
the second annealing temperature is different from the first annealing temperature, and
the silica salt layer comprises an ammonium hexafluorosilicate.

9. A method of forming a contact structure on a semiconductor substrate, comprising:
removing material from surfaces of a feature formed in a field region surface of the semiconductor substrate, wherein
removing the material forms a reaction product material over at least one of the field region surface and surfaces within the feature,
the surfaces within the feature comprise sidewalls and a contact surface, and
the surface of the sidewalls comprise silicon;
removing the reaction product material from the field region surface and the surfaces within the feature;
selectively forming a silica salt layer over the contact surface after the reaction product material has been removed from at least the contact surface of the surfaces within the feature;
exposing at least portion of the sidewalls and silica salt layer within the feature to a plasma that comprises an oxidizing agent;
removing the silica salt layer from the contact surface;
forming a metal silicide layer on the contact surface, wherein forming the metal silicide layer on the contact surface comprises selectively depositing a first metal layer on the contact surface; and
filling the feature with a metal, wherein filling the feature comprises selectively depositing a second metal layer on the formed metal silicide layer.

10. The method of claim 9, wherein exposing at least the portion of the sidewalls and silica salt layer within the feature to a plasma forms a silicon oxynitride material on the surface of the sidewalls.

11. The method of claim 10, wherein selectively depositing a first metal layer on the contact surface comprises introducing a hydrogen-containing precursor and a first metal-containing precursor to the contact surface such that a first metal layer forms on top of the contact surface that comprises silicon or silicon germanium.

12. The method of claim 10, wherein selectively depositing a second metal layer on the formed metal silicide layer comprises introducing a first reducing agent and a second metal-containing precursor to the surface metal silicide layer.

13. The method of claim 10, wherein silica salt layer comprises an ammonium hexafluorosilicate.

14. A method of forming a contact structure on a semiconductor substrate, comprising:
treating an oxide layer formed on a contact junction, wherein
treating the oxide layer forms a first silica salt layer on the contact junction disposed within a contact feature, and
the contact feature comprises one or more surfaces that comprise silicon nitride;
removing the first silica salt layer;
forming a second silica salt layer on the contact junction;
exposing the second silica salt layer and the one or more surfaces to a plasma comprising oxygen, wherein the plasma forms a silicon oxynitride material on the one or more surfaces;
removing the second silica salt layer;
selectively forming a metal silicide layer on the contact junction;
selectively forming a first metal layer on the selectively formed metal silicide layer; and
filling the contact feature with a metal, wherein filling the feature comprises selectively depositing a second metal layer on the selectively formed first metal layer.

15. The method of claim 14, wherein selectively forming the first metal layer on the metal silicide layer comprises exposing the contact junction to a non-fluorine-containing precursor.

16. The method of claim 15, wherein the non-fluorine-containing precursor comprises tungsten and a chlorine containing gas.

17. The method of claim 16, wherein the metal silicide layer comprises titanium.

18. The method of claim 15, wherein selectively forming the second metal layer on the first metal layer comprises exposing the contact junction to a fluorine-containing precursor.

19. The method of claim 14, wherein silica salt layer comprises an ammonium hexafluorosilicate.

20. The method of claim 14, wherein selectively forming the first metal layer on the metal silicide layer comprises exposing the contact junction to a metal precursor that comprises molybdenum (Mo).

* * * * *